US005834770A

United States Patent [19]

Holkeboer et al.

[11] Patent Number: 5,834,770

[45] Date of Patent: Nov. 10, 1998

[54] ION COLLECTING ELECTRODE FOR TOTAL PRESSURE COLLECTOR

[75] Inventors: David H. Holkeboer, Byron Center, Mich.; Louis C. Frees, Manlius, N.Y.

[73] Assignee: Leybold Inficon, Inc., East Syracuse, N.Y.

[21] Appl. No.: 891,694

[22] Filed: Jul. 11, 1997

Related U.S. Application Data

[60] Provisional application No. 60/041,032, Mar. 21, 1997.

[51] Int. Cl.[6] ...... H01J 37/08

[52] U.S. Cl. ...... 250/281; 250/283

[58] Field of Search ...... 250/281, 282, 250/283, 292, 288, 423 R

[56] References Cited

U.S. PATENT DOCUMENTS

| | | | |
|---|---|---|---|
| 3,974,380 | 8/1976 | Rettinghaus et al. | 250/288 |
| 5,320,827 | 6/1994 | Foley | 250/292 |

FOREIGN PATENT DOCUMENTS

| | | |
|---|---|---|
| 647963A2 | 9/1994 | European Pat. Off. . |

*Primary Examiner*—Kiet T. Nguyen
*Attorney, Agent, or Firm*—Wall Marjama Bilinski & Burr

[57] ABSTRACT

A mass spectrometer gas analyzer includes an ion source for producing ions of a sample gas in a defined ion volume. An ion analyzer collects and analyzes a first portion of the produced ions to determine a partial pressure for a selected gas species within the sample gas. An oppositely disposed ion collector collects a second portion of the ions to determine a total pressure of the contained gas sample. A collecting surface of the ion collector is positioned relative to the incoming ion beam to allow collection of ion current but the surface is configured such that a substantial portion of a plurality of secondary electrons produced by ion bombardment with the ion collector are deflected away from the ionization volume. The partial pressure is thus determined by the ion analyzer without secondary electrons entering the ion analyzer.

13 Claims, 7 Drawing Sheets

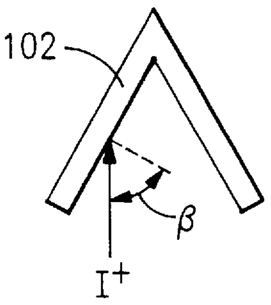
FIG.7A
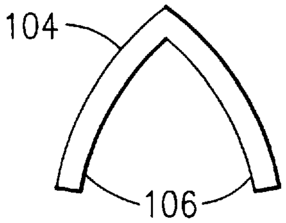
FIG.7B
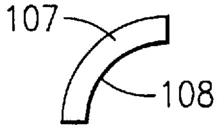
FIG.7C
FIG.8
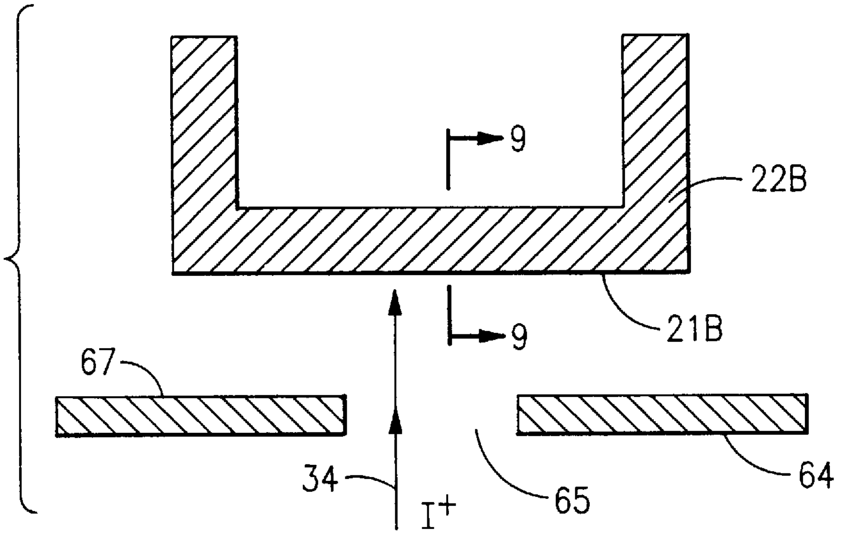
FIG.9
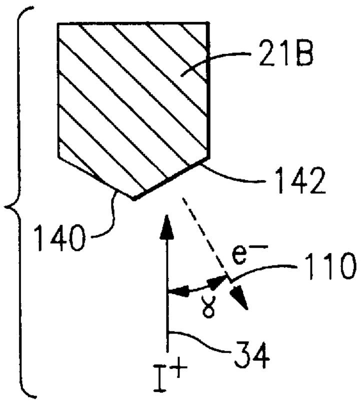

ION COLLECTING ELECTRODE FOR TOTAL PRESSURE COLLECTOR

This application is based on a Provisional application of U.S. application Ser. No. 60/041,032 filed Mar. 21, 1997 [Attorney Docket No. 247-110PRO/946104].

FIELD OF THE INVENTION

This invention relates to a mass spectrometer used for the analysis of gases in vacuum process equipment, and in particular, to a total pressure collector used in measuring a total pressure of a gas sample.

BACKGROUND OF THE INVENTION

When carrying out manufacturing processes in vacuum environments, it is frequently useful or necessary to employ a small, or "miniaturized", mass spectrometer to indicate the gas species present in the rarified atmosphere within the process zone. A miniature mass spectrometer is able to operate at higher absolute pressures (i.e., not as much vacuum) than a conventionally sized mass spectrometer, thereby being useful for monitoring some processes, such as sputter deposition of thin films, which cannot be monitored by conventional equipment. Such a mass spectrometer is commonly attached directly to the process vessel and operates in the vacuum which is generated by the process system. Mass spectrometers designed for this purpose frequently include a secondary sensing apparatus for indicating the operating vacuum level, such as a total pressure collector or a vacuum gauge, in addition to a primary sensing apparatus for indicating the partial pressure of interest.

Total pressure measuring apparatus typically consists of an ion collector electrode, incorporated in an ion source assembly, with suitable electronic circuits to amplify and measure the electric current thus collected. Typical designs of ion sources include arrangements shown in FIGS. 3A–3C, whereby an ion collector can be positioned to collect a portion of either a primary or a secondary ion beam. When calibrated with reference to a suitable vacuum gauge (not shown), the current collected by such an ion collector can be used to indicate the degree of vacuum achieved.

It has been observed that a simple ion collector, as described above, produces a secondary effect which can potentially degrade the overall performance of the mass spectrometer in respect to its primary function, i.e., the detection of different ion species.

Typically, an ion collector 22, shown adjacent a dual ion source 16 as depicted in FIG. 4A, is essentially at ground potential, so that the small currents usually found can be conveniently amplified and measured with circuits well known in the art. A defined ionization volume 26, where the ions are generated, is operated at a positive potential by biasing an electrode, such as an anode 44, typically in the 80 to 200 volt range with respect to ground, so that positive ions are attracted to the ion collector 22. An ion collector focus plate 64 having an opposite negative potential is optionally used to accelerate ion movement to the ion collector 22. Ions then strike the ion collector 22 with sufficient energy to cause the emission of significant quantities of electrons, known as secondary electrons. This well known effect is described in publications such as *Methods of Experimental Physics,* vol. 4, Academic Press (1962), the contents of which are herein incorporated by reference.

These secondary electrons are emitted in random directions with kinetic energies in the range of a few electron volts. In the above dual ion source, an ion collecting surface

21 of the ion collector 22 directly faces the electrically positive surfaces forming the ionization volume 26.

Consequently, the secondary electrons are accelerated back into the ionization volume 26, with a portion passing through the exit aperture 50 of an oppositely disposed focus plate 48 and into the entrance 52 of an ion analyzer 18, such as a quadrupole mass analyzer. A portion of the stream of secondary electrons pass through the mass analyzer 18 because the electrons have sufficient velocity to transit the length of the analyzer during a small period of the analyzer selection cycle when the separating voltage is at or near zero. Other types of ion analyzers may also be subject to similar secondary electron effects.

The deleterious effect of secondary electron current on the output of the ion detector 20 is depicted graphically in FIGS. 5A–5B. FIG. 5A illustrates a recording of the ion detector output current in the form of a mass spectrum taken at a low absolute pressure, such that the total pressure ion current measured by the ion collector 22 is small and the secondary electron current is therefore also small. FIG. 5B shows a similar measurement taken at a higher absolute pressure. In this instance, the total pressure current measured at the ion collector is significantly larger, as is the secondary electron current due to a relatively larger number of secondary electrons being formed. The effect of the secondary electron current is the superimposition of a negative current onto the positive mass spectrum. This negative current is largest in magnitude at minimum mass and decreases as the mass increases. The secondary electron effect is largest at low masses because the separating voltages of the quadrupole ion analyzer are proportional to the masses. As is apparent from the Figs., the presence of this superimposed negative current makes accurate measurement of the amplitudes of the positive peaks in the mass spectrum difficult to achieve.

SUMMARY OF THE INVENTION

It is therefore an object of the present invention to provide a total pressure collector that overcomes the drawbacks and limitations of the prior art.

Another object of the present invention is to provide a total pressure collector that directs secondary electrons away from an ion measuring device, such as used in a dual ion or other ion source.

Briefly stated and according to a preferred aspect of the present invention, a mass spectrometer gas analyzer includes an ion source for producing ions of a sample gas in an ionization volume. An ion analyzer collects and analyzes a first portion of the produced ions to determine a partial pressure for a selected gas species within the sample gas. An ion collector collects a second portion of the produced ions to determine a total pressure of said gas sample. According to the invention, the ion collector includes a collecting surface which is configured relative to an ion beam such that a substantial portion of a plurality of secondary electrons produced by ion bombardment with the ion collector are deflected away from the ionization volume.

Preferably, a dual ion source is utilized in which the ion collector and the ion analyzer are oppositely disposed relative to a common ionization volume. The collecting surface can be shaped or positioned relative to the ion source to cause secondary electrons to be deflected and absorbed away from the defined ionization volume from which the ion beam originates.

According to another preferred aspect of the present invention, a mass spectrometer gas analyzer includes source means for producing ions of a sample gas in a defined ionization volume, ion analyzing means for collecting and analyzing a first portion of the produced ions from the ionization volume to determine a partial pressure for a selected gas species within the sample gas, ion collecting means for collecting a second portion of the produced ions from the ionization volume to determine a total pressure of the gas sample, and deflection means for preventing a substantial portion of a plurality of secondary electrons produced by the ion analyzing means from being directed back into the ionization volume.

According to another preferred aspect of the present invention, a mass spectrometer gas analyzer includes an ion source for producing ions of a sample gas in a defined ionization volume, an ion analyzer for analyzing a first portion of the ions to determine a partial pressure for a selected gas species within the sample gas, and a ion collector for collecting a second portion of the ions to determine a total pressure of the gas sample, wherein an ion collecting surface of the ion collector is configured such that a substantial portion of a plurality of secondary electrons produced by ion bombardment of the ion collector are deflected away so as to be prevented from reentering the ionization volume.

An advantage of the present invention is that secondary electrons from the ion stream exiting the ion source are prevented from reentering the ionization volume and the ion analyzer.

A further advantage of the present invention is that the deleterious effect of negative ion current on the overall performance of a mass spectrometer or other gas analysis system is significantly diminished, particularly at higher operating pressures and with low masses.

Other objects, features and advantages of the present invention will become apparent from the following description read in conjunction with the accompanying drawings.

BRIEF DESCRIPTION OF THE DRAWINGS

FIGS. 7A–7C illustrate total pressure collectors having alternately constructed ion collecting surfaces according to the present invention;

FIG. 8 is a top view of a total pressure collector according to an embodiment of the invention; and FIG. 9 is a side sectional view of the embodiment of FIG. 8 taken along the line 9—9.

DETAILED DESCRIPTION OF THE INVENTION

Figure 1:
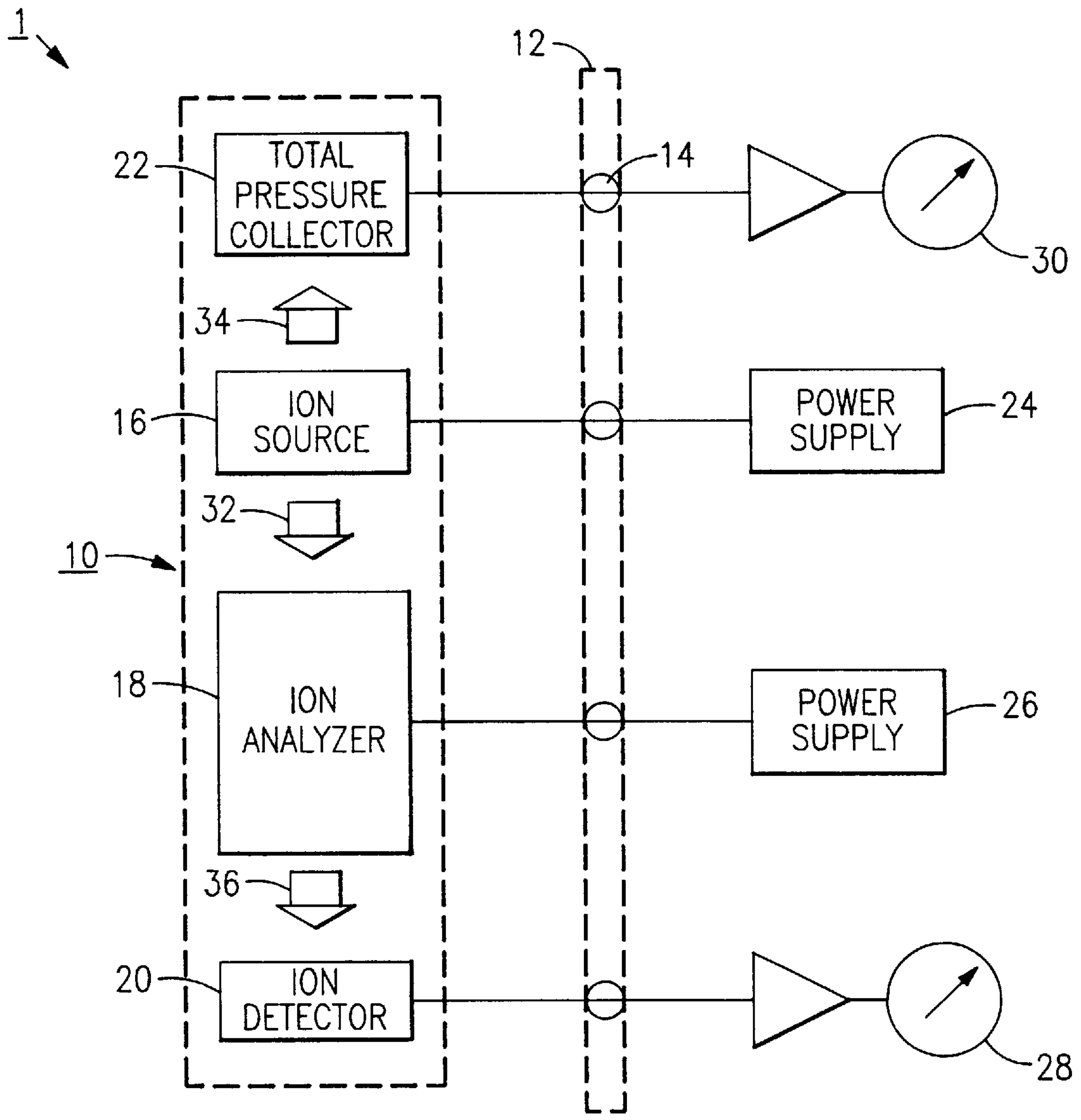
FIG. 1 is a schematic diagram of a dual ion source assembly.
Figure 4A:
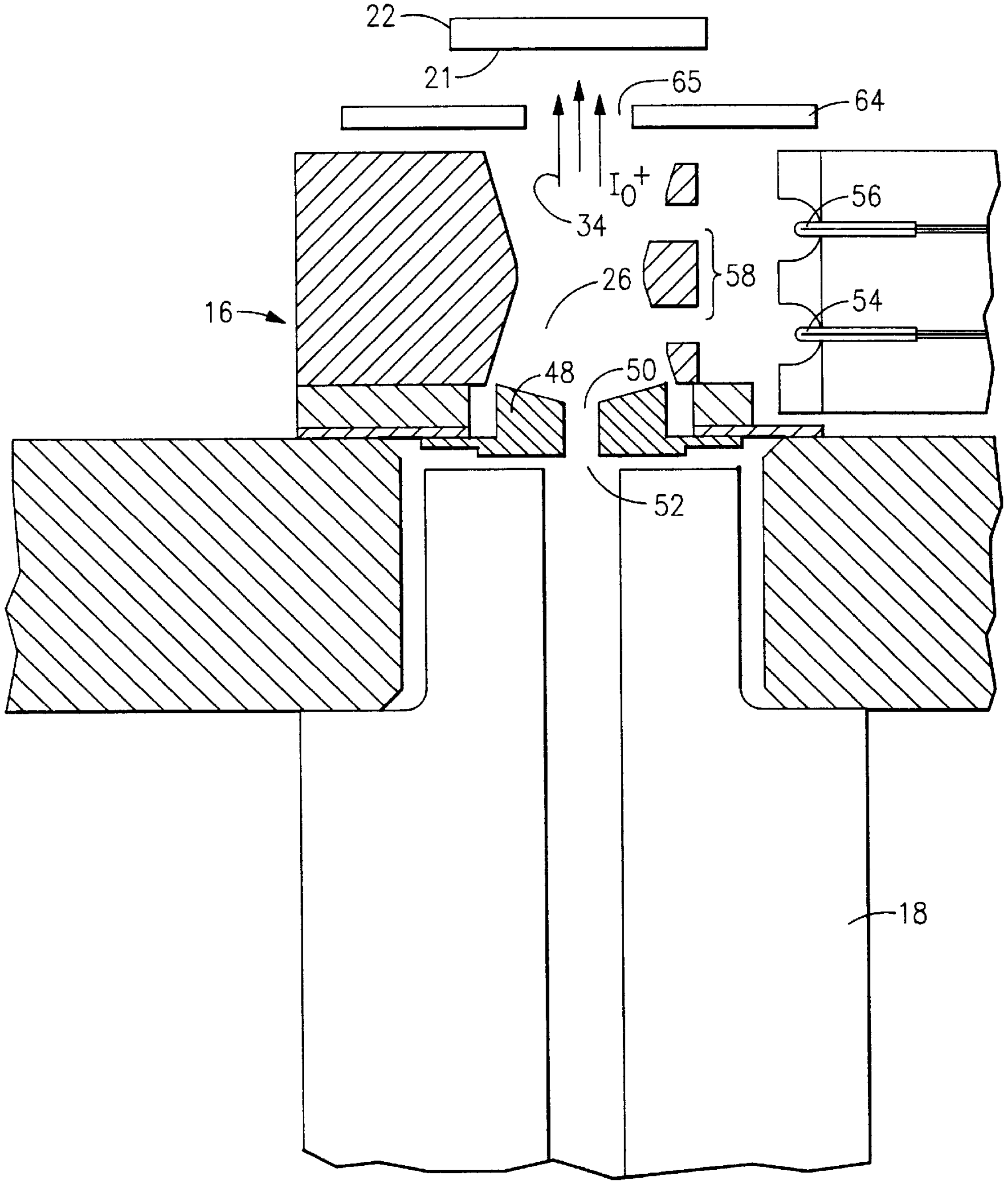
FIG.4A Prior Art
FIG. 4A is a partial top sectional view of a mass spectrometer with a total pressure collector according to the prior art.
Figure 4B:
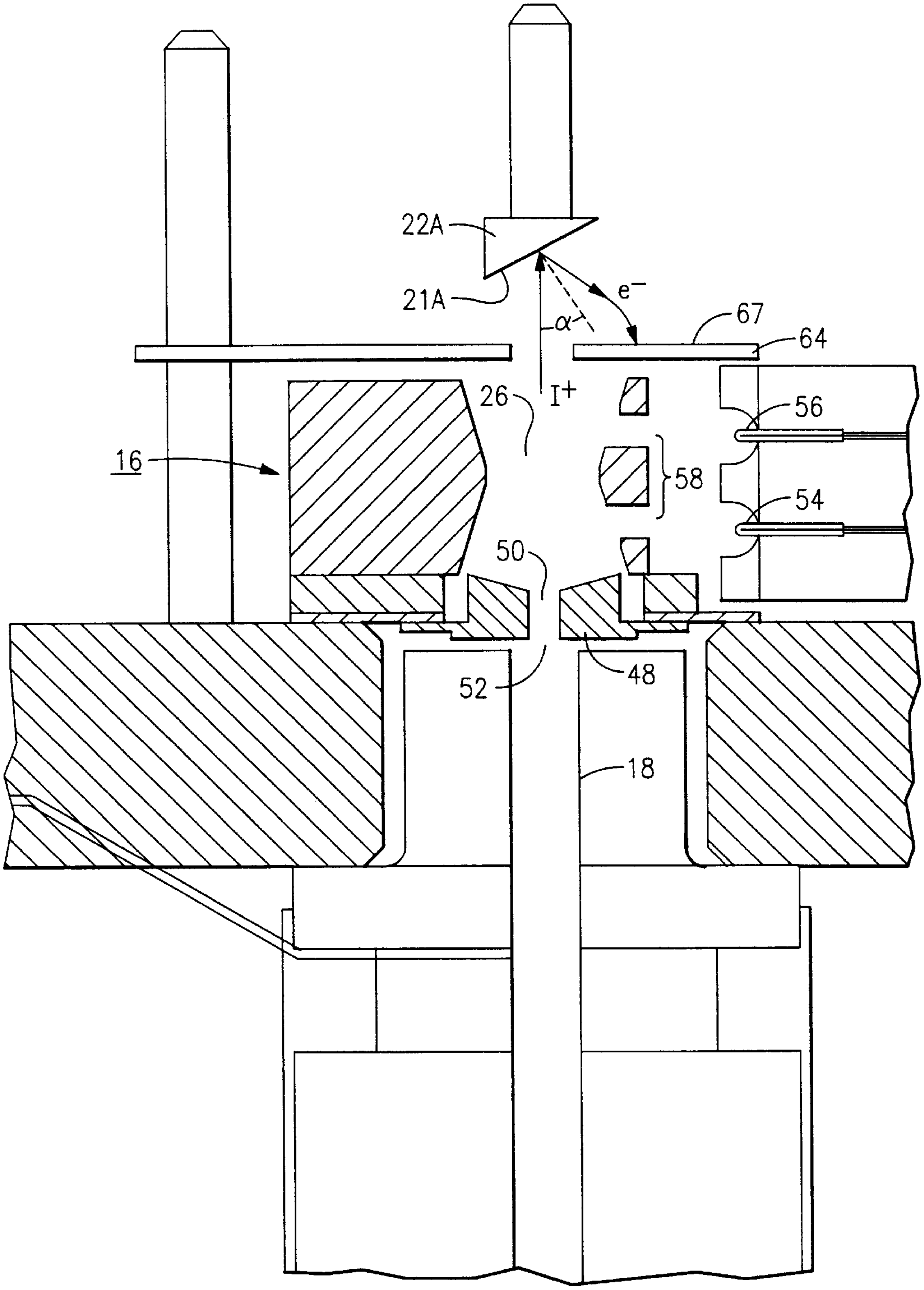
FIG. 4B is a partial top sectional view of a mass spectrometer with a total pressure collector according to an embodiment of the present invention.

The following description relates to a primary embodiment illustrated in FIGS. 1 and 4B, for overcoming those problems presented by the prior art configuration of FIG. 4A. Alternate embodiments are referred to by way of FIGS. 7A–7C, 8, and 9.

Referring to the drawings, and more specifically to FIG. 1, a block or schematic diagram is illustrated for a gas analysis sensor such as a quadrupole mass spectrometer 1. According to this specific embodiment, the sensor includes a sensor assembly 10 mounted within a housing 12, shown only partially, containing electrically insulated, hermetically sealed connections 14 so that the sensor can be operated in a high vacuum with an external apparatus for providing the necessary power inputs and for measuring the sensor outputs.

The sensor assembly 10 includes an ion source 16, an ion analyzer 18 such as a quadrupole mass filter, an ion detector 20, and a total pressure collector 22. According to this embodiment, the total pressure collector 22 is oppositely disposed relative to the ion source 16 with respect to the ion analyzer 18 and the ion detector 20. Separate suitable electrical power supplies 24 and 26 provide necessary voltages and currents for the ion source 16 and the ion analyzer 18, respectively. A suitable amplifier and indicator 28 measures the output of the ion detector 20, while a similar amplifier and indicator 30 measures the output of the total pressure collector 22. The electrical connections shown indicate general functions and may in fact represent a number of electrical conductors between sensor components and their respective external components.

The ion source 16 as illustrated in FIG. 1, and more completely in FIGS. 4A and 4B is referred throughout the course of this discussion as a dual ion source. A more complete description is provided below, but in brief, a dual ion source 16 utilizes a common ionization volume 26, FIG. 4A, situated between the oppositely disposed ion analyzer 18 and the total pressure (ion) collector 22, from which a primary ion beam 32 is extracted for focusing onto the ion analyzer 18, and a secondary ion beam 34 which is similarly extracted and directed to the ion collector.

The ion analyzer 18, such as a quadrupole mass filter, selects ions of a particular species according to mass, i.e., selected ions 36, for transmission to the ion detector 20 while rejecting or diverting ions of all other masses. The adjacent ion detector 20, such as a simple Faraday cup (FC) or secondary electron multiplier (SEM), or equivalent thereof, collects and converts the selected ions 36 to an electric current which can be externally measured by the arranged amplifier and indicator 28 to indicate the quantity of ions collected. Details relating to the quadrupole mass filter, and the amplifier/indicators are commonly known in the field and do not form an essential part of the present invention, except as indicated.

The oppositely disposed total pressure (ion) collector 22 captures the entirety of the secondary beam 34 of ions containing all ion species, regardless of mass, and converts them to an electric current. Through calibration with another vacuum gauge, the vacuum level in the defined ionization volume is calculated from the magnitude of the total pressure current. As noted above, a separate amplifier and indicator 30 similarly indicates the quantity of ions collected by the total pressure collector 22, also in a manner known to those of skill in the art.

Figure 2:
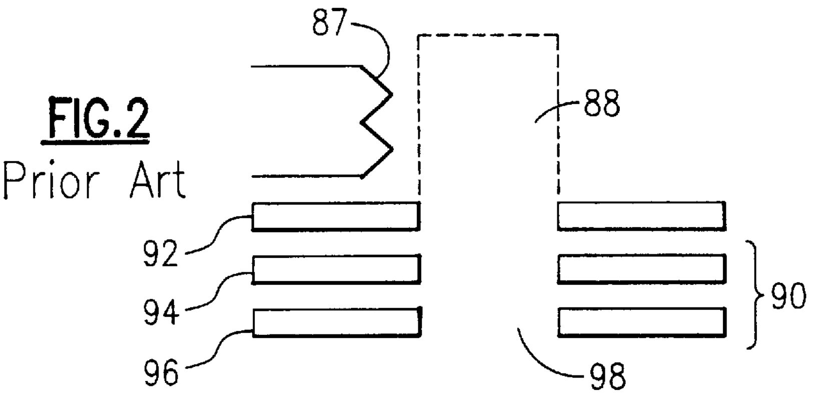
FIG.2 Prior Art
FIG. 2 is a schematic diagram of a typical ion source known in the prior art and useful in the present invention.

For purposes of clarity, and to provide a better understanding of the teachings of the present invention, background is herein provided with reference to a prior art single ion source as illustrated in FIG. 2. The single ion source 86 includes at least one filament 87 which, when heated, provides a suitable quantity of electrons by thermionic emission. Electrons from the heated filament 87 are accelerated into a defined ionization volume 88, typically of cylindrical configuration, where incoming gas molecules of a gas sample are bombarded and ionized by electron impact. It is known that charged molecules, i.e., ions, can be manipulated by an electric field. Therefore, and by providing an opposite electrical potential, the ions can be extracted from the defined ionization volume 88 so as to be converged and focused into a suitable ion beam by means of an ion lens assembly 90.

Still referring to FIG. 2, a typical ion lens assembly 90 consists of three concentric elements, 92, 94, and 96, each element having a coaxial through aperture 98. The first or closest element 92 to the interior of the ion source 86 actually forms the border or periphery of the ionization volume 88, while the remaining two elements are spaced, thin disc-like elements 94, 96 which provide an electrical potential to converge and focus an ion beam from the defined ionization volume for focusing at the entrance of an ion analyzer (not shown) or ion collector (not shown).

The dual ion source 16, an example of which is described more completely below with reference to FIGS. 4A and 4B, defines a preferred arrangement of a total pressure collector 22. Alternate positions for the total pressure collector, are herein referred to by way of FIGS. 3A–3C.

Figure 3A:
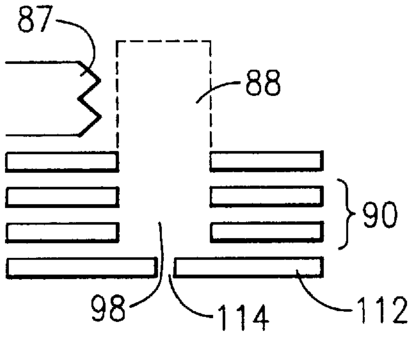
FIG.3A Prior Art
FIG. 3A is a schematic diagram of a specific total pressure sensing apparatus according to the prior art.

FIG. 3A illustrates a total pressure sensing apparatus as used in the single ion source of FIG. 2. Similar parts are labeled throughout with the same reference numerals for the sake of convenience. A beam aperture plate 112 having a centrally disposed beam aperture 114 extending through the thickness thereof is provided adjacent the ionization volume 88 of the ion source 86. The beam aperture 114 allows the beam of ions provided by the heated filament 87, as focused by the ion lens assembly 90 to reach the ion analyzer (not shown) while the remainder of the plate 112 blocks or intercepts ions outside the focused beam of ions. The beam aperture plate 112 is electrically isolated from the remainder of the sensor assembly structure and is connected to a suitable amplifier and measuring system, such as shown schematically in FIG. 1, to indicate the amount of current collected.

Figure 3B:
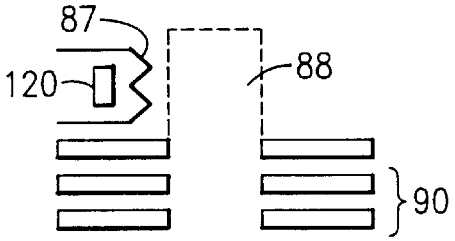
FIG.3B Prior Art
FIG. 3B is a schematic diagram of a second specific total pressure sensing apparatus according to the prior art.
Figure 3C:
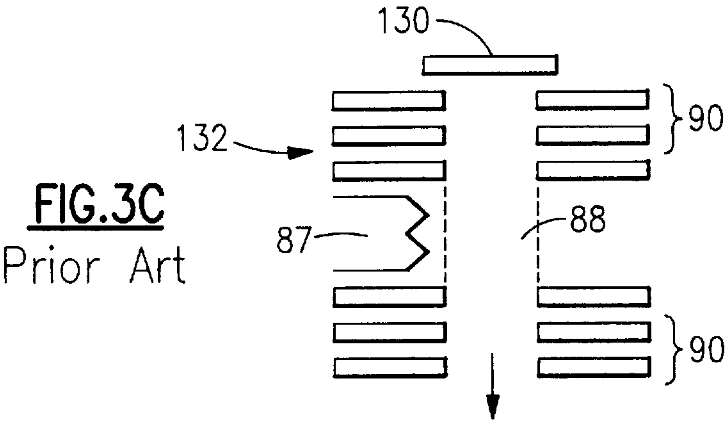
FIG.3C Prior Art
FIG. 3C is a schematic diagram of a third specific total pressure sensing apparatus according to the prior art.

FIG. 3B illustrates a total pressure collecting apparatus 120 alternately located outside the similarly defined ionization volume 88 and ion lens assembly 90 as shown, while FIG. 3C shows a total pressure collecting apparatus 130 with a dual ion source 132 in which a pair of ion beams (not shown) are generated within the ionization volume 88 by the heated filament 87. As noted above, one ion stream is used for sample gas analysis, while a second oppositely converging ion stream is directed to toward the total pressure collector 130. The total pressure collector 130 is electrically isolated from the rest of the sensor structure and is connected to a suitable amplifier and measuring system (not shown) to indicate the amount of current collected. In use, the dual ion source 132 functions in the same manner as the dual ion source 16 illustrated in FIG. 1.

With the above background, a more detailed discussion of the dual ion source 16 as used in connection with the total pressure collector 22 is now provided with reference to FIGS. 4A and 4B.

Specifically, a pair of electrodes, namely an anode 44 having a substantially frustoconical interior and a substantially planar focus plate 48 having a center aperture 50 together define the ionization volume 26, as well as form an ion lens assembly 60 which converges the primary ion beam 32, FIG. 1, from the ionization volume to a focus at the entrance 52 of the ion analyzer 18. In this embodiment, electrons from a pair of adjacent heated filaments 54, 56 enter the ionization volume 26 through slots 58 provided in the body of the anode 44 and through which ionization of a contained rarified gas sample takes place. The gas sample is added from an external source (not shown) in a known manner.

Ions formed from the electrons emitted by the first filament 54 are converged and focused by the electric fields as defined by the shaping of the interior of the anode 44 and the focus plate 48 through the central aperture 50 into the ion analyzer 18 where a partial pressure of the gas sample can be measured. Details pertaining to the construction of the anode to form a two element ion lens assembly is provided in commonly assigned and copending U.S. application Ser. No. 08/891,648, [Attorney Docket 247-109] filed concurrently herewith, the contents of which were previously incorporated by reference above.

Similarly, ions formed from electrons emitted by the second filament 56 are collected by the ion collector 22 as accelerated through a total pressure collector focus plate 64 having a similar aperture 65. Additional details relating to the dual ion source 16 are contained in copending and commonly assigned U.S. application Ser. No. 08/642,479, filed May 3, 1996 [Attorney Docket 247_096], the entire contents of which are herein incorporated by reference.

Referring now to FIG. 4B, the identical system of FIG. 4A is shown with the exception of ion collector 22A which includes an ion collecting surface 21A which is angled relative to the secondary ion beam 34. Positive ions contained within the secondary ion beam 34, schematically represented by $I^+$, strike the angled collecting surface 21A of the ion collector 22, creating a secondary electron $e^-$. Although each secondary electron $e^-$ is emitted in a random direction, because the electron accelerating field proximate to the collecting surface 21A of the ion collector 22 is essentially perpendicular thereto. Therefore, each secondary electron $e^-$ is accelerated in a path essentially perpendicular to the collecting surface 21A.

According to this particular embodiment, however, the ion collecting surface 21A is angled relative to the ion path such that most of the secondary electrons do not re-enter the ionization volume 26, but instead impact upon an internal surface 67 (as perceived relative to the defined ionization volume 26) of the total pressure collector focus plate 64. An angle a between $\alpha$ normal to the collecting surface 21A and the axis of the secondary beam 34 of positive ions $I^+$ is preferably within the range of approximately 15–45 degrees.

Figure 5A:
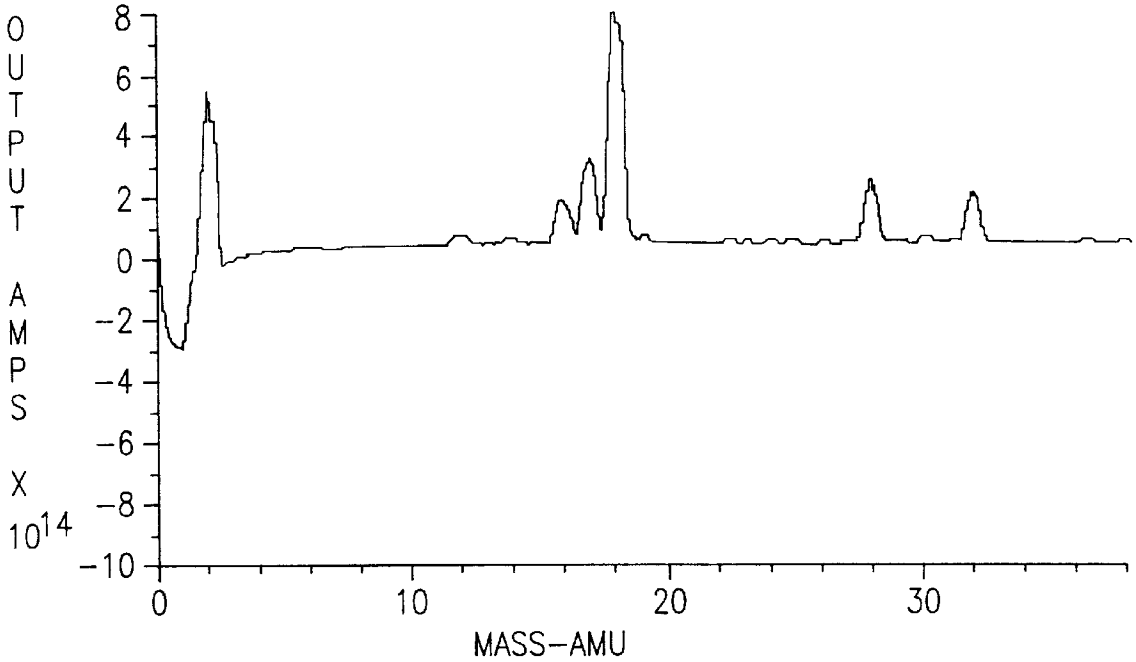
FIG. 5A is a graphical ion current output using the apparatus of FIG. 4A under low absolute pressure conditions.
Figure 5B:
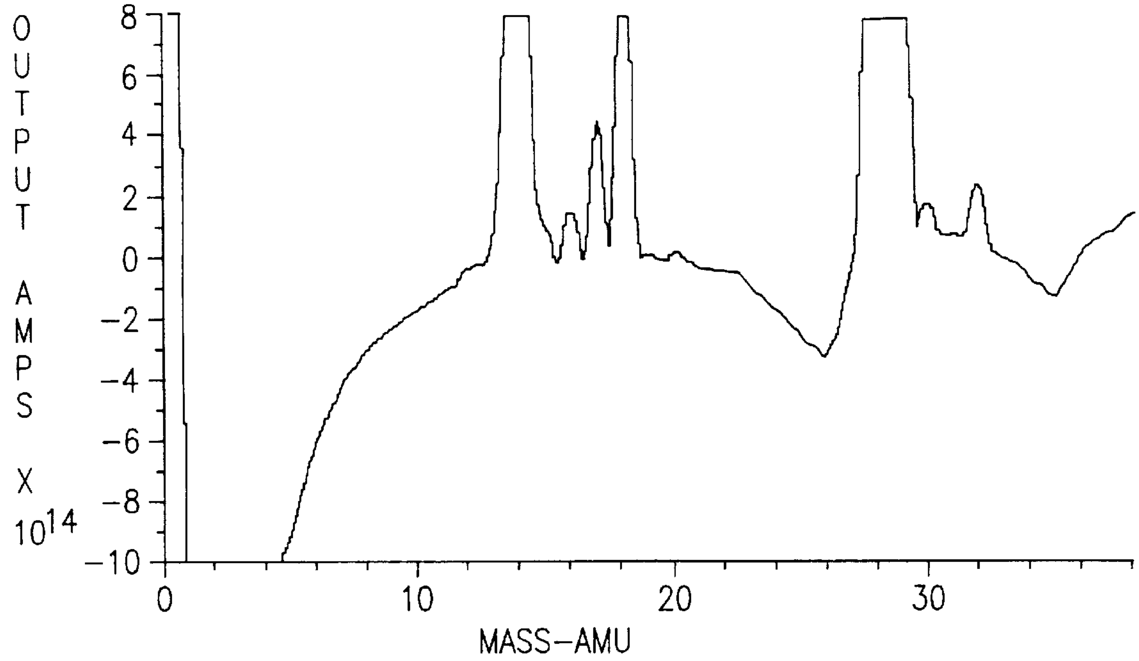
FIG. 5B is a graphical ion analyzer output using the apparatus of FIG. 4A under higher absolute pressure conditions than the conditions of FIG. 5A.
Figure 6A:
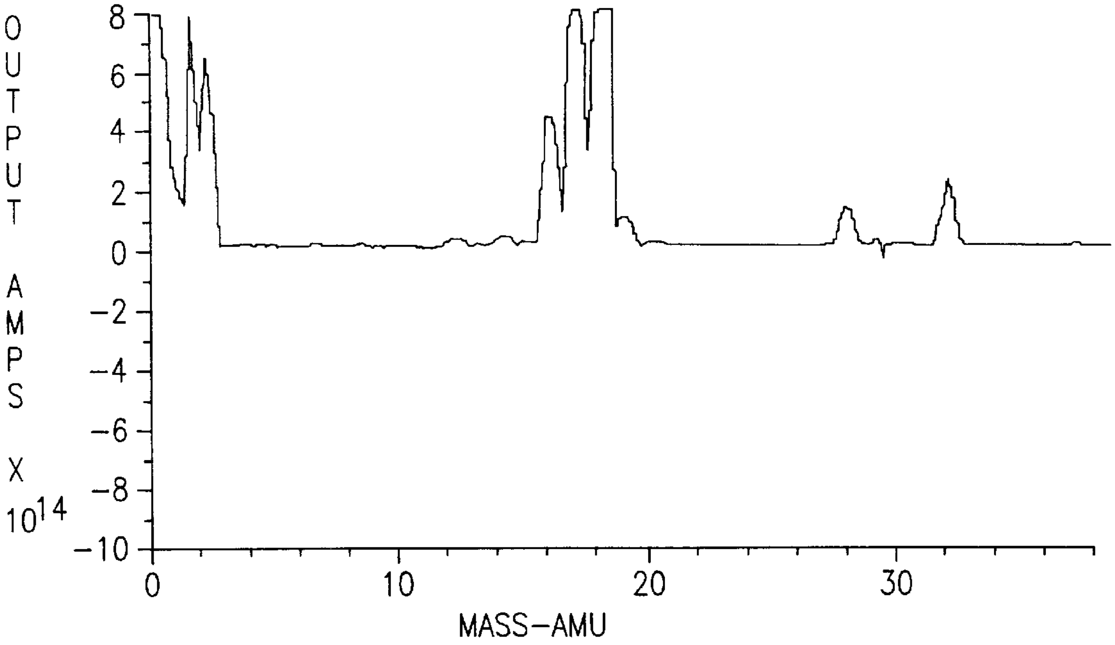
FIG. 6A is a graphical ion analyzer output using the apparatus of FIG. 4B under low absolute pressure conditions.
Figure 6B:
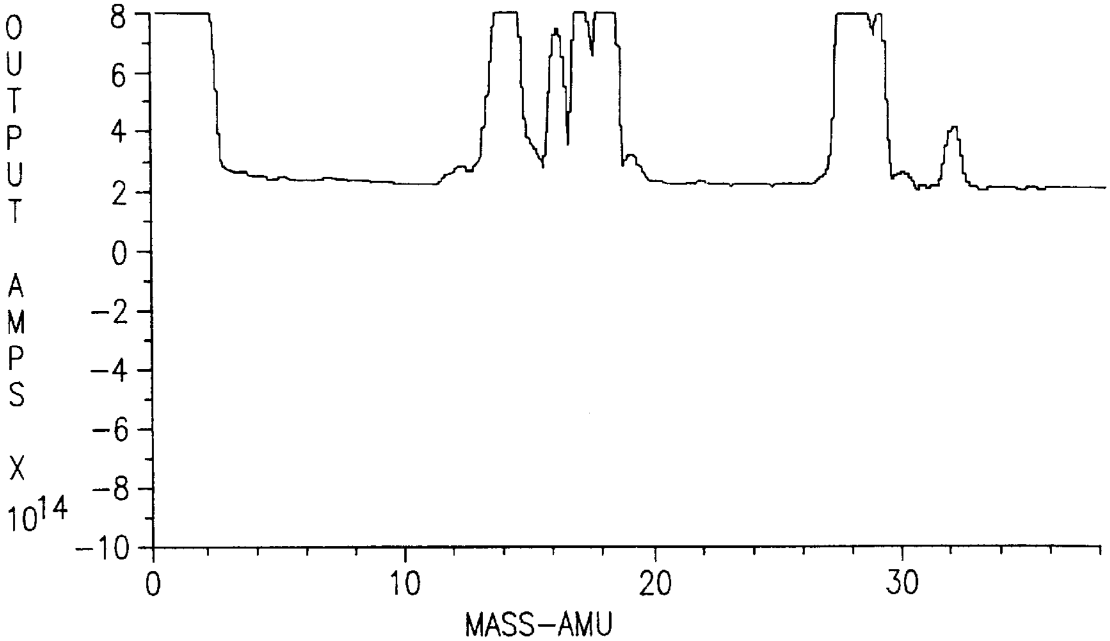
FIG. 6B is a graphical ion analyzer output using the apparatus of FIG. 4B under higher absolute pressure conditions than the conditions of FIG. 6A.

Referring to FIGS. 5A–6B, a comparison of the effects of the described modification to the total pressure ion collecting surface can be made by comparing the dual ion sources of FIGS. 4A and 4B. FIGS. 5A–5B depict a typical mass spectrum recording using those parameters and apparatus using the known ion collector depicted according to FIG. 4A. FIGS. 6A–6B illustrate a similar mass spectrum profile for the identical gas sample substituting the ion collecting plate 20 of FIG. 4B having ion collecting surface for the known ion collector 22 depicted in FIG. 4A. According to this specific embodiment, the ion collecting surface 21A of the ion collector 22 includes an angle $\alpha$ of 36°.

FIG. 6A illustrates the ion output current in the form of a mass spectrum at a low absolute pressure such that the total pressure ion current measured by the presently described ion collector 20 is small and the secondary electron current is therefore also small. FIG. 6B shows a similar measurement taken at a higher absolute pressure in which the total pressure current is large, as is the secondary electron current due to a relatively larger number of secondary electrons being formed. Using the ion collector having the angled ion collecting surface 21A, the superimposed negative current on the positive mass spectrum of FIG. 5B caused by the effect of the secondary electron current is eliminated, as depicted in FIG. 6B. Measuring the amplitudes of the peaks in FIG. 6B is now easily accomplished to measure the separate components comprising the gas sample.

The preceding describes a specific embodiment by which an interior ion collecting surface of the ion collector can be manufactured to successfully deflect secondary electrons away from the ionization volume. It will be readily apparent that other shapes or configurations for an ion collecting surface are possible. Referring now to FIGS. 7A–7C, several possible alternate embodiments are illustrated of ion collecting surface designs for the total pressure collector. Such alternative embodiments include ion collecting surfaces 102 having an inward "V"-shape as illustrated in FIG. 7A, Other similar shapes can be utilized, as shown by collecting surfaces 106 and 108 for respective ion collectors 104 and 107, respectively, the overall purpose of the collecting surface being to provide means for deflecting any secondary electrons to a location other than into the ionization volume 26. Referring to FIG. 7A, it has been determined for the above described embodiment that an angle $\beta$ between the positive ion stream 34 and the normal to the ion collecting surface 102 is preferably in the range from about 20°–45°. As with the previously described embodiments, the shapes have surfaces that are preferably angled such that most of the secondary electrons are preempted from reentering the ionization volume. As seen, a planar ion collecting surface can be utilized, provided that the surface is tilted with respect to the secondary ion beam 34 in order to deflect secondary electrons from a direct line of sight with the center aperture 65 of the focus plate 64, and ultimately with the entrance 52, FIG. 4B, of the ion analyzer 18, FIG. 4B.

Referring to FIGS. 8 and 9, still other similar variations can easily be imagined. For example, a variation of the "V" shape is shown in which a convex "V" runs lengthwise along the ion collector 22B essentially parallel to a length of total pressure collector focus plate 64; that is, a pair of outwardly converging surfaces 140, 142 extending in a direction which extends into and out of the plane of the paper as seen in FIG. 8. A suitable angle $\gamma$ between the positive ion stream 34 and the normal 10 to the ion collecting surface 142 is preferably about 30°. The secondary electrons are deflected above and below the aperture 65 in the total pressure collector focus plate 64 instead of to the side of the aperture. It will be readily apparent that still other variations are conceivable employing the concepts described herein.

PARTS LIST FOR FIGS. 1–9

1 mass spectrometer
10 sensor assembly
12 housing
14 electrical connections
16 ion source
18 ion analyzer
20 ion detector
21 ion collecting surface
22 total pressure collector
24 filament
26 ionization volume
28 amplifier and indicator
30 amplifier and indicator
32 primary ion beam
34 secondary ion beam
36 selected ions
44 anode
48 focus plate
50 center aperture
52 entrance-ion analyzer
54 filament
56 filament
58 slots
60 ion lens assembly
64 collector focus plate
65 center aperture
67 external surface of focus plate
80 ion source
87 filament
88 ionization volume
90 ion lens assembly
92 element
94 disc
96 disc
98 through apertures
100 inwardly V-shaped ion collector plate
102 angled interior collecting surface
104 curved V-shaped ion collecting plate
106 interior ion collecting surface
107 curved ion collector plate
108 interior ion collecting surface
109 ion collecting plate
110 beveled interior ion collecting surface
112 beam aperture plate
114 beam aperture
132 dual ion source
134 ionization volume
136 heated filament
138 ion lens assemblies
140 beveled ion collecting surface
142 beveled ion collecting surface Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A mass spectrometer gas analyzer, comprising:

source means for producing ions of a sample gas in a defined ionization volume;

first analyzing means for collecting and analyzing a first portion of produced ions to determine a partial pressure for a selected gas species within said sample gas;

second analyzing means for collecting and analyzing a second portion of said ions to determine a total pressure of said gas sample; and deflection means for deflecting a substantial portion of a plurality of secondary electrons produced by said second analyzing means away from said ionization volume.

2. A mass spectrometer gas analyzer as recited in claim 1, wherein:

said second analyzing means includes a total pressure ion collector arranged in proximity to said ionization volume; and said deflection means includes a collecting surface of said total pressure ion collector, said collecting surface being configured to prevent secondary electrons formed from contacting said collecting surface to be redirected into said ionization volume.

3. A mass spectrometer gas analyzer as recited in claim 2, wherein said first analyzing means includes a quadrupole mass filter oppositely arranged with respect to said source means from said total pressure collector, said mass filter having means for analyzing a specific portion of ions created by said source means.

4. A mass spectrometer gas analyzer as recited in claim 2, wherein a normal of said collecting surface of said total pressure ion collector is angled with respect to an ion stream comprising said second portion of ions, said angle being in a range from about 15 degrees to about 45 degrees.

5. A mass spectrometer gas analyzer as recited in claim 4, wherein said collecting surface of said total pressure ion collector is essentially planar, said surface being angled relative to said ionization volume to prevent secondary electrons produced by said collecting surface from being directed into said ionization volume.

6. A mass spectrometer gas analyzer as recited in claim 4, wherein said collector surface is essentially V-shaped.

7. A mass spectrometer gas analyzer, comprising:

an ion source for producing ions of a sample gas in an ionization volume;

an ion analyzer for analyzing a first portion of said ions to determine a partial pressure for a selected gas species within said sample gas; and an ion collector, for collecting a second portion of said ions to determine a total pressure of said gas sample, wherein a collecting surface of said ion collector is configured relative to said second beam such that a substantial portion of a plurality of secondary electrons produced by ion bombardment of said ion collector by said second beam are deflected away from said ionization volume.

8. A mass spectrometer gas analyzer as recited in claim 7, wherein said ion analyzer is a quadrupole mass filter.

9. A mass spectrometer gas analyzer as recited in claim 8, wherein said ion collector is a total pressure collector capable of measuring ions for establishing a total pressure for a sample gas retained in said ionization volume.

10. A mass spectrometer gas analyzer as recited in claim 9, wherein said total pressure collector includes a collecting surface arranged in proximity to said ionization volume, said surface being configured for receiving ions from said volume, said surface being further configured for deflecting secondary electrons produced by contact with said collecting surface from being directed into said ionization volume.

11. A mass spectrometer gas analyzer as recited in claim 10, wherein said collecting surface is angled with respect to said ionization volume, said angle being in the range of between approximately 20 to 45 degrees relative to an incoming ion beam.

12. A mass spectrometer gas analyzer as recited in claim 10, wherein said collecting surface includes a beveled shape.

13. A mass spectrometer gas analyzer as recited in claim 12, wherein said collecting surface is V-shaped.

* * * * *